(12) United States Patent
Lin et al.

(10) Patent No.: US 11,824,128 B2
(45) Date of Patent: Nov. 21, 2023

(54) PHOTOCURRENT-GENERATING ELECTRODE

(71) Applicant: NATIONAL CHUNG-HSING UNIVERSITY, Taichung (TW)

(72) Inventors: Kuan-Jiuh Lin, Taichung (TW); Wen-Yin Ko, Taichung (TW)

(73) Assignee: NATIONAL CHUNG-HSING UNIVERSITY, Taichung (TW)

( * ) Notice: Subject to any disclaimer, the term of this patent is extended or adjusted under 35 U.S.C. 154(b) by 0 days.

(21) Appl. No.: 17/585,011

(22) Filed: Jan. 26, 2022

(65) Prior Publication Data

US 2023/0261122 A1   Aug. 17, 2023

(51) Int. Cl.
*H01L 31/00* (2006.01)
*H01L 31/0224* (2006.01)
*H01L 31/042* (2014.01)

(52) U.S. Cl.
CPC .......... *H01L 31/022466* (2013.01); *H01L 31/022425* (2013.01); *H01L 31/042* (2013.01)

(58) Field of Classification Search
CPC .......... H01L 31/022466; H01L 31/022425
See application file for complete search history.

(56) References Cited

FOREIGN PATENT DOCUMENTS

TW        201528529 A    *  7/2015

OTHER PUBLICATIONS

English machine translation of TW 201528529 A (Year: 2022).*
Feng ("Thermal conductivity and secondary porosity of single anatase TiO2 nanowire") Nanotechnology 23 (2012) 185701 (Year: 2012).*

* cited by examiner

*Primary Examiner* — Angelo Trivisonno
(74) *Attorney, Agent, or Firm* — MLO, a professional corp.

(57) ABSTRACT

A photocurrent-generating electrode includes a supporting substrate, a first nanoparticle layer, a second nanoparticle layer, and a semiconductor nanostructure formed on the second nanoparticle layer and having a biocompatible semiconductor nanomaterial. The first nanoparticle layer has first noble metal nanoparticles bonded to the supporting substrate. The second nanoparticle layer is formed on the first nanoparticle layer, and has second noble metal nanoparticles having an average dimension larger than an average dimension of the first noble metal nanoparticles. Two adjacent ones of the second noble metal nanoparticles are electrically connected to each other through one of the first noble metal nanoparticles.

14 Claims, 9 Drawing Sheets

PHOTOCURRENT-GENERATING ELECTRODE

FIELD

The disclosure relates to a photocurrent-generating electrode, and more particularly to a photocurrent-generating electrode including nanoparticles.

BACKGROUND

Taiwanese Invention Patent Publication No. TWI517418B discloses a method for modifying a titanium dioxide nanowire substrate with metal nanoparticles, and includes the following steps: (1) hydrothermally forming a titanium dioxide layer (including titanium dioxide nanowires) on a transparent conductive glass substrate so as to form a titanium dioxide nanowire substrate (i.e., a substrate having titanium dioxide nanowires thereon), the titanium dioxide nanowires having a length that ranges from 100 nm to 1000 nm and a width that ranges from 5 nm to 50 nm; (2) sputtering a first metal layer (including a plurality of metal particles) on a surface of the titanium dioxide nanowire substrate formed in step (1) so as to obtain a stack body; and (3) calcining the stack body obtained in step (2) at a temperature ranging from 300° C. to 800° C. so as to convert the first metal layer into a second metal layer, the second metal layer including metal nanoparticles that has a diameter ranging from 5 nm to 50 nm. The transparent conductive glass substrate might be a glass substrate having a conductive layer made of indium tin oxide or fluorine-doped tin oxide. The first metal layer might be made of a metal selected from the group consisting of gold, silver, copper, and combinations thereof.

The metal nanoparticle-modified titanium dioxide nanowire substrate exhibits localized surface plasmon resonance (LSPR), which improves absorption of visible light, and when applied to solar cells, a power generation efficiency of the solar cells can be improved. With development of solar cells, there is a continuous need to provide a solar cell with improved absorption efficiency of visible light.

SUMMARY

Therefore, an object of the disclosure is to provide a photocurrent-generating electrode which is capable of improving absorption efficiency of visible light.

According to the disclosure, the photocurrent-generating electrode includes a supporting substrate, a first nanoparticle layer, a second nanoparticle layer, and a semiconductor nanostructure. The first nanoparticle layer has a plurality of first noble metal nanoparticles which are spaced apart from each other and which are firmly bonded to an upper major surface of the supporting substrate. The second nanoparticle layer is formed on the first nanoparticle layer opposite to the supporting substrate, and has a plurality of second noble metal nanoparticles which are spaced apart from each other and which have an average dimension larger than an average dimension of the first noble metal nanoparticles. Two adjacent ones of the second noble metal nanoparticles are electrically connected to each other through a corresponding one of the first noble metal nanoparticles such that the second nanoparticle layer is capable of exhibiting surface plasmon resonance when stimulated by a visible light.

The semiconductor nanostructure is formed on the second nanoparticle layer opposite to the supporting substrate, and includes a biocompatible semiconductor nanomaterial.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
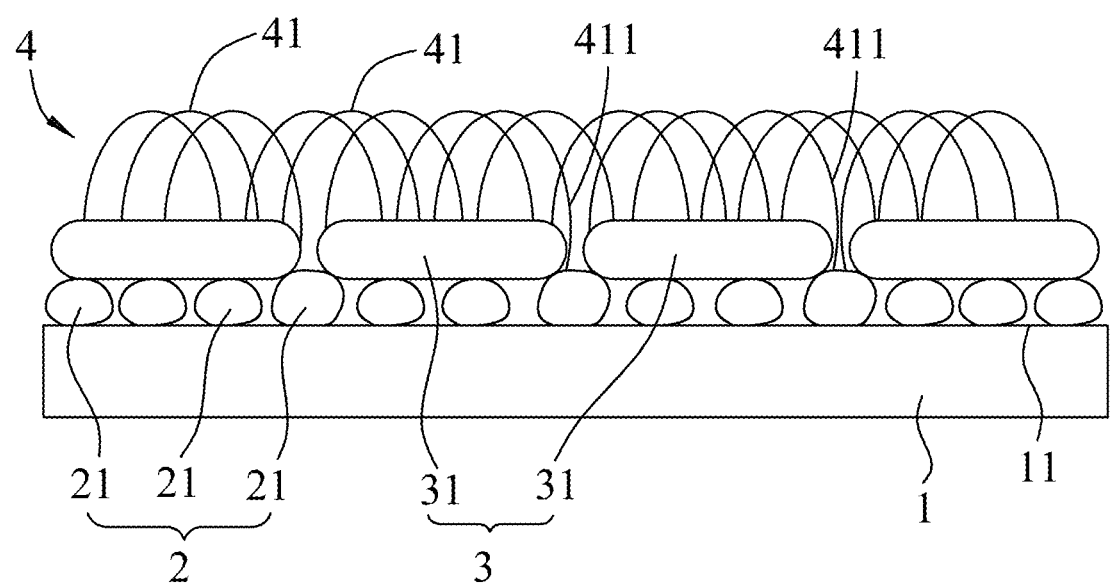
FIG. 1 is a schematic cross-sectional view illustrating an embodiment of a photocurrent-generating electrode according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a photocurrent-generating electrode according to the present disclosure includes a supporting substrate 1, a first nanoparticle layer 2, a second nanoparticle layer 3 capable of exhibiting surface plasmon resonance (SPR) when stimulated by visible light, and a semiconductor nanostructure 4.

The supporting substrate 1 has an upper major surface 11 facing toward the first nanoparticle layer 2. In certain embodiments, the supporting substrate 1 may be a light-transmissive substrate. The supporting substrate 1 may be made of, for example, but not limited to, at least one of the following materials: glass, ceramic, silicon, silicon carbide, and silicon nitride. In some embodiments, the supporting substrate 1 is made of a material selected from the group consisting of glass, ceramic, silicon, silicon carbide, silicon nitride, and combinations thereof. In this embodiment, the supporting substrate 1 is a glass supporting substrate.

The first nanoparticle layer 2 includes a plurality of first noble metal nanoparticles 21 which are spaced apart from each other and which are firmly bonded to the upper major surface 11 of the supporting substrate 1. In certain embodiments, the first noble metal nanoparticles 21 have an average dimension ranging from about 1 nm to about 20 nm. Each of the first noble metal nanoparticles 21 may be made of, for example, but not limited to, at least one of the following materials: gold, silver, and copper. In some embodiments, each of the first noble metal nanoparticles 21 is made of a material selected from the group consisting of copper, gold, silver, and combinations thereof. Since gold nanoparticles have excellent conductivity and biocompatibility, in this embodiment, the first noble metal nanoparticles 21 are gold nanoparticles.

The second nanoparticle layer 3 is formed on the first nanoparticle layer 2 distal from the supporting substrate 1, and has a plurality of second noble metal nanoparticles 31 which are spaced apart from each other. Two adjacent ones of the second noble metal nanoparticles 31 are electrically connected to each other through a corresponding one of the first noble metal nanoparticles 21. The second noble metal nanoparticles 31 have an average dimension larger than an average dimension of the first noble metal nanoparticles 21. A ratio of the average dimension of the second noble metal nanoparticles 31 to the average dimension of the first noble metal nanoparticles is not less than about 5. In some embodiments, the average dimension of the second noble metal nanoparticles 31 ranges from about 50 nm to about 200 nm. Each of the second noble metal nanoparticles 31 may be made of, for example, but not limited to, at least one of the following materials: gold, silver, or the like. In some embodiments, each of the second noble metal nanoparticles 31 is made of a material selected from the group consisting of gold, silver, and a combination thereof. Since gold nanoparticles have excellent conductivity and biocompatibility and exhibit better SPR, in this embodiment, the second noble metal nanoparticles 31 are gold nanoparticles.

The semiconductor nanostructure 4 is formed on the second nanoparticle layer 3 distal from the supporting substrate 1, and includes a biocompatible semiconductor nanomaterial. In some embodiments, the semiconductor nanostructure 4 has a thickness ranging from about 200 nm to about 500 nm. In some embodiments, the semiconductor nanostructure 4 has a porosity of greater than about 60%. In certain embodiments, the semiconductor nanostructure 4 has semiconductor nanowires 41 which are made of the biocompatible semiconductor nanomaterial. That is, the semiconductor nanostructure 4 may have a plurality of nanowire portions 411 which surround the second noble metal nanoparticles 31 (see also FIGS. 8 and 9), respectively, so as to form an array of core-shell nanoparticles. The array of core-shell nanoparticles serves as a hybrid plasmonic quantum antenna monolayer. The biocompatible semiconductor nanomaterial may be, for example, but not limited to, metal oxide such as titanium oxide, zinc oxide, tungsten oxide, niobium oxide, or combinations thereof, or the like. In some embodiments, the biocompatible semiconductor nanomaterial is selected from the group consisting of titanium oxide, zinc oxide, tungsten oxide, niobium oxide, and combinations thereof. Since titanium dioxide has superior photocatalytic efficiency, photochemical stability, biocompatibility, corrosion resistance and etc., in this embodiment, the semiconductor nanostructure 4 has titanium dioxide nanowires 41. That is, the nanowire portions 411 are made of titanium dioxide. In addition, semiconductor nanostructure 4 including titanium dioxide and niobium oxide may help the photocurrent-generating electrode to absorb visible light and near-infrared light.

The photocurrent-generating electrode of the present disclosure may serve as a photocatalytic electrode. Through the surface plasmon resonance effect generated by the second nanoparticle layer 3 and formation of a Schottky barrier as an electron absorber at an interface between the semiconductor nanostructure 4 and the second nanoparticle layer 3, separation of electrons and holes is promoted. The separation of electrons and holes helps the photocatalytic electrode absorb visible light, so that the photocatalytic electrode has an excellent photocatalytic efficiency under irradiation of sunlight or a white light emitter. In addition, the photocurrent-generating electrode of the present disclosure may be used in water splitting (i.e., water electrolysis) to produce hydrogen and oxygen.

Method for Making the Photocurrent-Generating Electrode

The method for making the photocurrent-generating electrode of the present disclosure includes the following steps: a) depositing a first noble metal layer on the upper major surface 11 of the supporting substrate 1 (see FIG. 1); b) subjecting the first noble metal layer to a first microwave plasma such that the first noble metal layer is formed into the first nanoparticle layer 2, the first nanoparticle layer 2 including the first noble metal nanoparticles 21 which are spaced apart from each other and which are firmly bonded to the upper major surface 11 of the supporting substrate 1; c) forming an amino siloxane layer on the first nanoparticle layer 2 and applying a noble metal nanoparticle-containing solution on the amino siloxane layer; d) repeating step c) so as to form a first stack including a plurality of the amino siloxane layers and a plurality of noble metal nanoparticle-containing layers; e) after step d), subjecting the first stack to a second microwave plasma such that the amino siloxane layers are removed and noble metal nanoparticles in the noble metal nanoparticle-containing layers are formed into a plurality of noble metal nanoclusters spaced apart from each other on the first nanoparticle layer 2; f) heating the noble metal nanoclusters so that the noble metal nanoclusters on the first nanoparticle layer 2 are formed into the second noble metal nanoparticles 31, the second noble metal nanoparticles 31 constituting the second nanoparticle layer 3 on the first nanoparticle layer 2; and g) forming the semiconductor nanostructure 4 on the second nanoparticle layer 3 so as to obtain a second stack including the supporting substrate 1, the first nanoparticle layer 2, the second nanoparticle layer 3, and the semiconductor nanostructure 4, the semiconductor nanostructure 4 being made of the biocompatible semiconductor nanomaterial.

In some embodiments, deposition of the first noble metal layer in step a) is conducted by sputtering. The properties of the first nanoparticle layer 2 in step b) are the same as aforementioned, and thus, details thereof is omitted for the sake of brevity. In step c), the amino siloxane layer is formed by applying a solution including amino siloxane and a solvent on the first nanoparticle layer 2, and then removing the solvent to obtain the amino siloxane layer. The amino siloxane may be, but not limited to, 3-aminopropyltrimethoxysilane (APTMS), or the like. In certain embodiments, in step g), the semiconductor nanostructure 4 is formed on the second nanoparticle layer 3 by depositing a semiconductor precursor (i.e., a semiconductor layer) on the second nanoparticle layer 3, and then immersing a stack including the semiconductor layer, the first nanoparticle layer 2, and the second nanoparticle layer 3 into an alkaline solution, followed by subjecting the stack to annealing such that the semiconductor layer is formed into the semiconductor nanostructure 4. The semiconductor precursor is a material chosen according to the semiconductor nanomaterial mentioned above. For example, when the semiconductor nanomaterial is titanium dioxide, the semiconductor precursor is titanium.

Photoelectric Immunosensing Device

Figure 2:
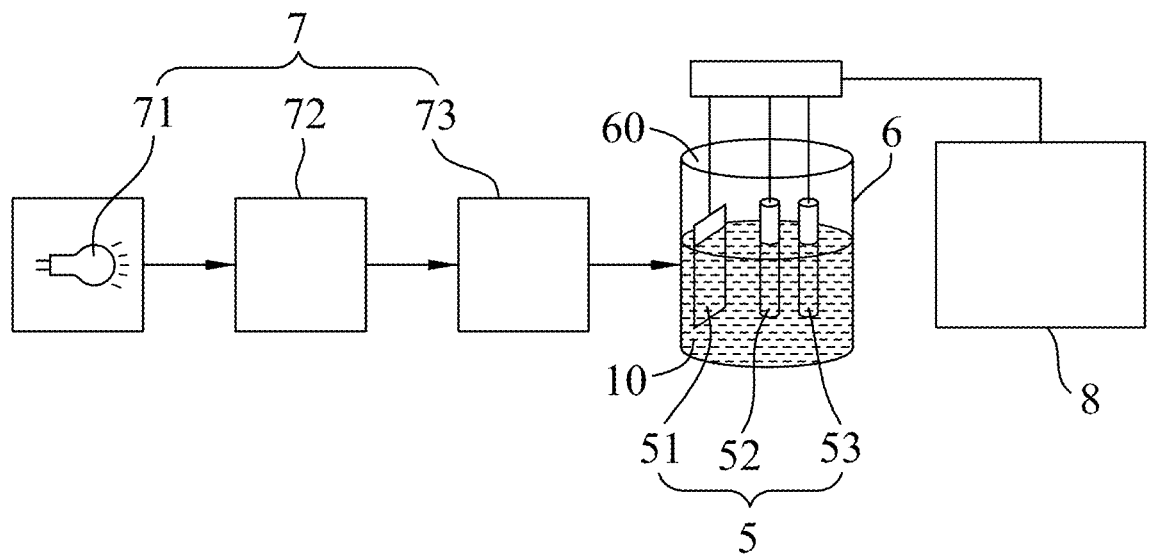
FIG. 2 is a schematic view of a first embodiment of a photoelectric immunosensing device according to the present disclosure.

Referring to FIG. 2, a first embodiment of a photoelectric immunosensing device for detecting a target 10 according to the present disclosure includes a photoelectric immunosensor 5, an retaining unit 6 for holding the photoelectric immunosensor 5, an optical unit 7, and a signal processor 8. The target 10 may be, for example, but not limited to, an alpha-fetoprotein (AFP), an immune protein, a drug, an antigen, an antibody, a pathogenicity factor, glucose, cysteine, glutathione, or the like.

The photoelectric immunosensor 5 includes the above-mentioned photocurrent-generating electrode 51, a reference electrode 52, and a counter electrode 53. The reference electrode 52 may be, for example, but not limited to, an Ag/AgCl electrode. The counter electrode 53 may be, for example, but not limited to, a carbon electrode. It is to be noted that, the reference electrode 52 may be omitted according to application requirements.

The retaining unit 6 includes a reaction container 60 for accommodation of the photoelectric immunosensor 5 and the target 10.

The optical unit 7 serves as a light source for irradiating the photocurrent-generating electrode 51. The optical unit 7 includes an illuminator 71, a monochromator 72 located downstream of the illuminator 71, and a chopper 73 located downstream of the monochromator 72. The illuminator 71 may be, for example, but not limited to, a white illuminator. The white illuminator may be, for example, but not limited to, a white light-emitting diode (LED). It is to be noted that, the monochromator 72 and the chopper 73 may be omitted according to application requirements.

In certain embodiments, the photoelectric immunosensor 5 further includes molecular probes (not shown) which are configured to be retained by the semiconductor nanostructure 4 and which have specific binding affinity to a plurality of the targets 10. That is, the molecular probes can bind specifically with the targets 10. The molecular probes may be, for example, but not limited to, an immune protein, a catalyst, a nucleic acid, an antibody, an antigen, or the like. The catalyst may be, for example, but not limited to, glucose oxidase (GOx), acetylcholinesterase (AChE), alkaline phosphatase (ALP), horseradish peroxidase (HRP), glucose dehydrogenase (GDH), or the like. The antibody may be, for example, but not limited to, anti-alpha-fetoprotein (anti-AFP).

It should be noted that the second nanoparticle layer 3 can exhibit SPR when stimulated by visible light. Therefore, when the optical unit 7 irradiates the photocurrent-generating electrode 51 of the photoelectric immunosensor 5, the electrons can be transferred between the second nanoparticle layer 3 and the semiconductor structure 4, thereby generating a redox reaction. Then, using the signal processor 8 (e.g., a computer) electrically connected to the photoelectric immunosensor 5, a first photocurrent-generating density signal can be obtained. In addition, when the photoelectric immunosensor 5 is in contact with the target 10, a second photocurrent-generating density signal can be obtained. Based on a difference between the first photocurrent-generating density signal and the second photocurrent-generating density signal, the target 10 can be analyzed qualitatively and/or quantitatively.

Figure 3:
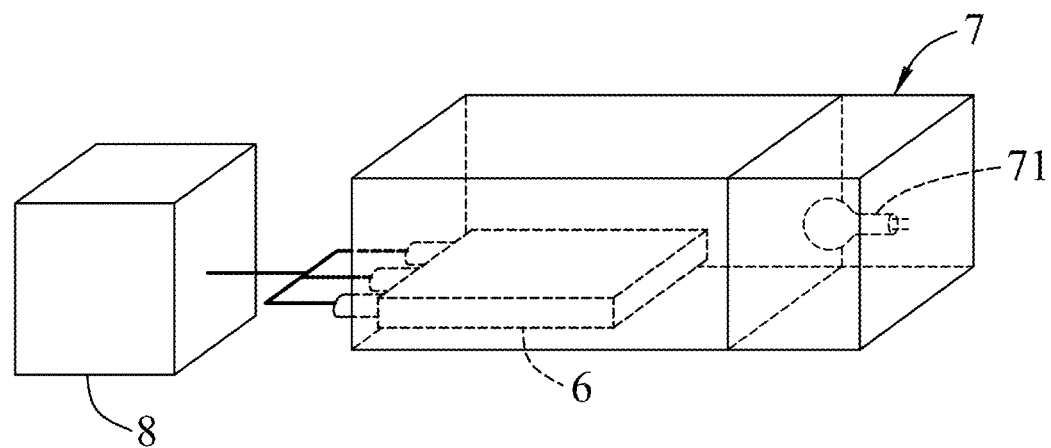
FIG. 3 is a schematic view of a second embodiment of the photoelectric immunosensing device according to the present disclosure.
Figure 4:
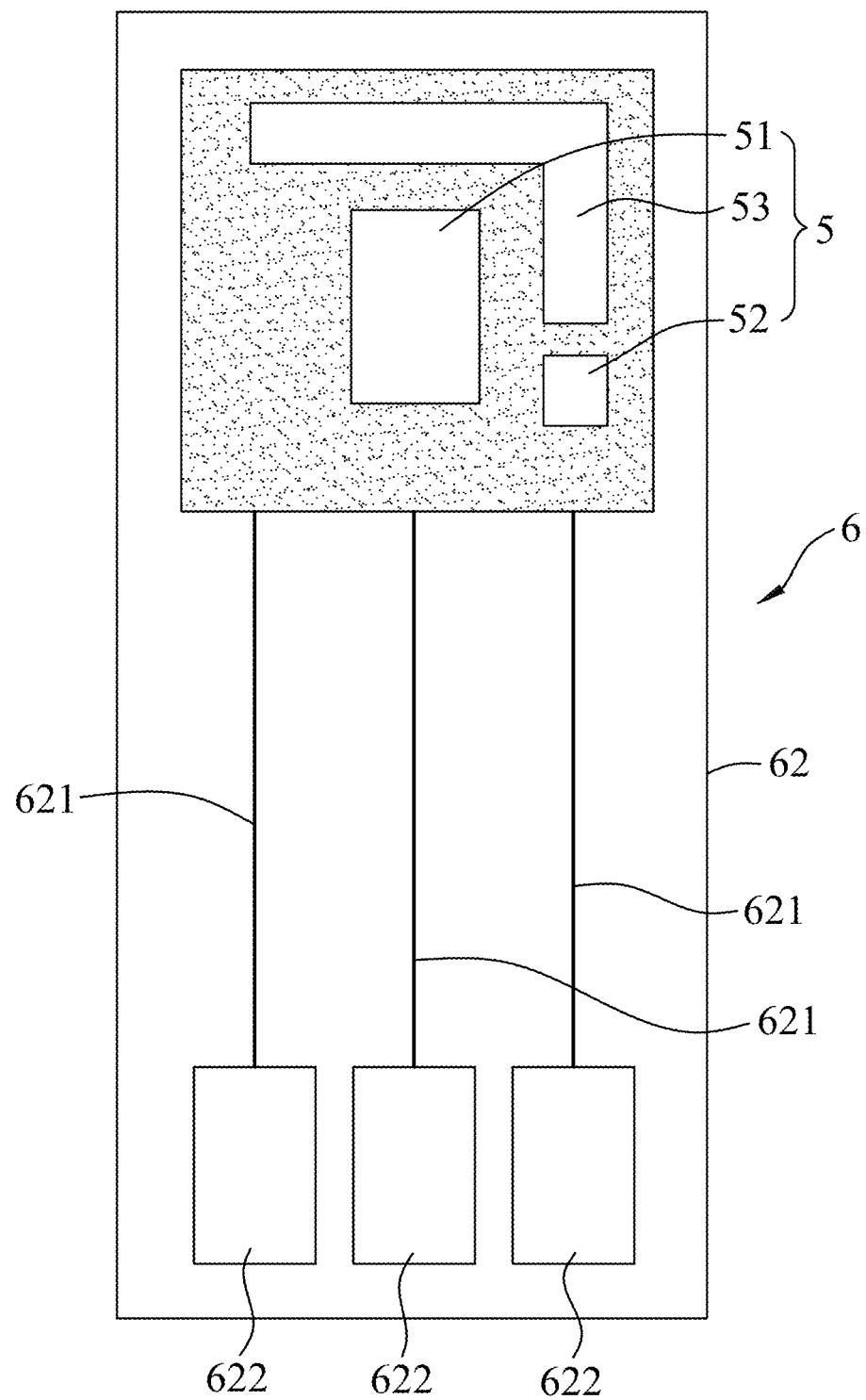
FIG. 4 is a schematic top view of a photoelectric immunosensor and a retaining unit of the second embodiment of the photoelectric immunosensing device according to the present disclosure.

FIGS. 3 and 4 illustrate a second embodiment of the photoelectric immunosensing device according to the present disclosure. The second embodiment of the photoelectric immunosensing device is similar to the first embodiment except that in the second embodiment, the retaining unit 6 is a circuit board 62. The circuit board 62 has three conductive lines 621 and three signal outputs 622 each electrically connected to a corresponding one of the conductive lines 621. Each of the photocurrent-generating electrode 51, the reference electrode 52, and the counter electrode 53 of the photoelectric immunosensor 5 is disposed on the circuit board 62, and is electrically connected to a corresponding one of the conductive lines 621.

In certain embodiments, the photoelectric immunosensor 5 further includes molecular probes (not shown) disposed on the photocurrent-generating electrode 51. The molecular probes are similar to those described above, and thus, details thereof is omitted for the sake of brevity.

The disclosure will be further described by way of the following examples and comparative examples. However, it should be understood that the following examples are solely intended for the purpose of illustration and should not be construed as limiting the disclosure in practice.

Preparation of Photocurrent-Generating Electrodes

Example 1 (E1)

A photocurrent-generating electrode of E1 was prepared as follows:

First, a glass supporting substrate was washed and dried so as to obtain a treated glass supporting substrate 1 (see FIG. 1). The treated glass supporting substrate and a gold target were then placed in a magnetron sputtering machine and subjected to a sputtering treatment, so that a sputtered gold film having a thickness of about 1.5 nm was formed on an upper major surface 11 of the treated glass supporting substrate 1.

Next, the sputtered gold film was subjected to a microwave plasma treatment so that the sputtered gold film was transformed into a first nanoparticle layer 2 having a thickness of about 10 nm, thereby obtaining a first laminate. The first nanoparticle layer 2 includes a plurality of first gold nanoparticles 21 that were spaced apart from each other, that were firmly bonded to the upper major surface 11 of the treated glass supporting substrate 1, and that had an average dimension of about 10 nm. The first laminate was subjected to a surface treatment using plasma for 10 minutes to obtain a treated first laminate.

Thereafter, the treated first laminate was subjected to following steps i) to iv). In step i), a gold nanoparticle solution was prepared as follows.

A chloroauric acid solution including water and chloroauric acid (tetrachloroauric acid, $HAuCl_4$) was prepared. A trisodium citrate solution including water and trisodium citrate was prepared, where a concentration of trisodium citrate in the trisodium citrate solution was 4 wt %. A tannic acid solution including water and tannic acid was prepared, where a concentration of tannic acid in the tannic acid solution was 1 wt %. A potassium carbonate aqueous solution including deionized water and potassium carbonate was prepared, where a concentration of potassium carbonate in the potassium carbonate aqueous solution concentration was 50 mM. The chloroauric acid solution (1 mL) was mixed with 79 mL of pure water, followed by adding 1 mL of the trisodium citrate solution and then adding 0.1 mL of the tannic acid solution. Next, the potassium carbonate aqueous solution (0.05 mL) was added to obtain a mixed solution. The mixed solution was stirred at a temperature of about 60° C. for 1 hour, and then cooled to about 5° C., thereby obtaining the gold nanoparticle solution including a plurality of gold nanoparticles with a particle diameter of about 10 nm.

An amino siloxane solution (purchased from Aldrich) including 3-aminopropyl-trimethoxysilane was prepared. In step ii), the treated first laminate was immersed in the amino siloxane solution for about 30 minutes so that an amino siloxane layer was formed on the first nanoparticle layer 2 of the treated first laminate. In step iii), the treated first laminate formed with the amino siloxane layer was taken out from the amino siloxane solution, and then immersed in the gold nanoparticle solution by dipping. In step iv), the treated first laminate formed with the amino siloxane layer was taken out of the gold nanoparticle solution and purged by ethanol, followed by drying using nitrogen gas so that a gold nanoparticle structure having a thickness of about 10 nm and including a plurality of gold nanoparticles spaced apart from each other was formed on the amino siloxane layer, thereby obtaining a second laminate.

Subsequently, the second laminate was subjected to the aforementioned steps i) to iv) for 5 times to thereby obtain a third laminate. The third laminate includes the treated glass supporting substrate 1, the first nanoparticle layer 2 formed on the treated glass supporting substrate 1, six of the amino siloxane layers, and six of the gold nanoparticle structures stacked to alternate with the amino siloxane layers.

Afterwards, the third laminate was placed in a controlled environment that was evacuated to have a pressure of about $10^{-7}$ torr, followed by introducing argon gas having a pressure of about $10^{-1}$ torr to about $10^{-5}$ torr into the controlled environment. Then, the third laminate was subjected to a microwave plasma treatment to remove the amino siloxane layers and to form the gold nanoparticles of the gold nanoparticle structures into a plurality of gold nanoclusters, such that the gold nanoclusters were spaced apart from each other on the first nanoparticle layer 2.

Further, the gold nanoclusters were heated at a temperature of about 500° C. so that each of the gold nanoclusters was fused and was converted into a second gold nanoparticle 31, thereby obtaining a second nanoparticle layer 3 having a thickness of about 60 nm and including a plurality of the second gold nanoparticles 31 converted from the gold nanoclusters. Therefore, a fourth laminate was obtained. The second gold nanoparticles 31 of the second nanoparticle layer 3 had an average particle diameter of about 60 nm.

After that, the fourth laminate was purged and dried to obtain a treated fourth laminate. The treated fourth laminate and a titanium target were placed in a magnetron sputtering machine for sputtering so that a titanium layer having a thickness of about 50 nm was formed on an upper major surface of the second nanoparticle layer 3 of the treated fourth laminate, thereby obtaining a fifth laminate. A sodium hydroxide aqueous solution including water and sodium hydroxide was prepared, where a concentration of sodium hydroxide in the sodium hydroxide aqueous solution was 5 M. The fifth laminate was placed in an autoclave, followed by adding 13 mL of the sodium hydroxide aqueous solution into the autoclave. Then, the autoclave was placed in a high-temperature furnace and subjected to a hydrothermal reaction at a temperature of about 80° C. for 1 hour, so that the titanium layer was transformed into a titanium dioxide layer (i.e., the semiconductor nanostructure 4) having a thickness of about 248.6 nm and including titanium dioxide nanowires 41, thereby obtaining a sixth laminate. The titanium dioxide layer 4 had a porosity of about 83%. After completion of the hydrothermal reaction, the autoclave was taken out of the high-temperature furnace and placed in a cold water bath for cooling. A nitric acid aqueous solution including water and nitric acid was prepared, where a concentration of nitric acid in the nitric acid aqueous solution was about 0.1 M. Thereafter, the sixth laminate was taken out of the autoclave, and the nitric acid aqueous solution was used to remove unreacted residues of the sodium hydroxide aqueous solution on a surface of the sixth laminate, followed by purging the sixth laminate with deionized water. Then, the sixth laminate was immersed in ethanol for approximately 5 seconds, and then dried using a nitrogen gun. Lastly, the sixth laminate was placed in the high-temperature furnace and subjected to a calcination treatment at a temperature of about 500° C. for 1 hour so as to obtain the photocurrent-generating electrode of the present disclosure. In the photocurrent-generating electrode, the first nanoparticle layer 2 had a thickness of about 10 nm, the second nanoparticle layer 3 had a thickness of about 90 nm, and the titanium dioxide layer 4 (i.e., the semiconductor nanostructure 4) had a thickness of about 227.3 nm.

Example 2 (E2)

A photocurrent-generating electrode of E2 was prepared using procedures substantially the same as those of E1, except that the calcination treatment was not performed.

Comparative Example 1 (CE1)

A photocurrent-generating electrode of CE1 was prepared as follows:

First, a glass substrate having a fluorine-doped tin oxide conductive layer was subjected to purging and drying so as to obtain a processed glass substrate. The processed glass substrate and a gold target were placed in a magnetron sputtering machine and then subjected to a sputtering treatment, such that a sputtered gold film having a thickness of about 10 nm was formed on an upper surface of the processed glass substrate. Then, the sputtered gold film was subjected to a microwave plasma treatment to transform the sputtered gold film into a first layer having a thickness of about 10 nm, thereby obtaining a first layered body. The first layer includes a plurality of gold nanoparticles which are spaced apart from each other, and which are fixedly embedded on the upper surface of the processed glass substrate. The gold nanoparticles have an average particle diameter of about 10 nm. The first layered body was then subjected to a surface treatment using plasma for about 10 minutes so as to obtain a plasma-treated first layered body.

Next, the plasma-treated first layered body was purged and dried to obtain a processed first layered body. The processed first layered body and a titanium target were placed in a magnetron sputtering machine and then subjected to sputtering, such that a titanium layer having a thickness of about 50 nm was formed on an upper surface of the first layer of the processed first layered body, thereby obtaining a second layered body. The second layered body was placed in an autoclave, and 13 mL of a sodium hydroxide aqueous solution (including water and sodium hydroxide, a concentration of sodium hydroxide in the sodium hydroxide aqueous solution being 5 M) was added into the autoclave. Thereafter, the autoclave was placed in a high-temperature furnace and subjected to a hydrothermal reaction at a temperature of about 80° C. for 1 hour, so that the titanium layer was transformed into a titanium dioxide layer having a thickness of about 248.6 nm and including titanium dioxide nanowires, thereby obtaining a third layered body. After completion of the hydrothermal reaction, the autoclave was taken out of the high-temperature furnace and placed in a cold water bath for cooling. Then, the third layered body was taken out of the autoclave, and a nitric acid aqueous solution (including water and nitric acid, a concentration of the nitric acid in the nitric acid aqueous solution being about 0.1 M) was used to remove unreacted residues of the sodium hydroxide aqueous solution on a surface of the third layered body, followed by purging the third layered body with deionized water. Then, the third layered body was immersed in ethanol for approximately 5 seconds, and then dried using a nitrogen gas gun to form a fourth layered body.

Afterwards, a surface of the titanium dioxide nanowires of the titanium dioxide layer of the fourth layered body was sputtered with a first gold layer including a plurality of gold particles that are spaced apart from each other and that have an average particle diameter of about 10 nm, followed by calcination at a temperature of about 500° C. to transform the first gold layer into a second gold layer including gold particles with an average particle diameter of about 10 nm, thereby obtaining a photocurrent-generating electrode.

Comparative Example 2 (CE2)

A photocurrent-generating electrode of CE2 was prepared as follows:

First, a glass substrate having a fluorine-doped tin oxide conductive layer was subjected to purging and drying so as to obtain a processed glass substrate. The processed glass substrate and a gold target were placed in a magnetron sputtering machine and subjected to a sputtering treatment, such that a sputtered gold film having a thickness of about 1 nm was formed on an upper surface of the processed glass substrate. Then, the sputtered gold film was subjected to a microwave plasma treatment so as to transform the sputtered gold film into a first layer having a thickness of about 10 nm, thereby obtaining a first layered body. The first layer includes a plurality of gold nanoparticles which are spaced apart from each other and which are fixedly embedded on the upper surface of the processed glass substrate. The gold nanoparticles have an average particle diameter of about 10 nm. The first layered body was then subjected to a surface treatment using plasma for about 10 minutes so as to obtain a plasma-treated first layered body.

Thereafter, the plasma-treated first layered body was purged and dried to obtain a processed first layered body. The processed first layered body and a titanium target were placed in a magnetron sputtering machine and subjected to sputtering, such that a titanium layer having a thickness of about 50 nm was formed on an upper surface of the first layer of the processed first layered body, thereby obtaining a second layered body. The second layered body was placed in an autoclave, and 13 mL of a sodium hydroxide aqueous solution (including water and sodium hydroxide, a concentration of sodium hydroxide in the sodium hydroxide aqueous solution being 5 M) was added into the autoclave. Thereafter, the autoclave was placed in a high-temperature furnace and subjected to a hydrothermal reaction at a temperature of about 80° C. for 1 hour, so that the titanium layer was transformed into a titanium dioxide layer having a thickness of about 248.6 nm and including titanium dioxide nanowires, thereby obtaining a third layered body. After completion of the hydrothermal reaction, the autoclave was taken out of the high-temperature furnace and placed in a cold water bath for cooling. Then, the third layered body was taken out of the autoclave, and a nitric acid aqueous solution (including water and nitric acid, a concentration of the nitric acid in the nitric acid aqueous solution being about 0.1 M) was used to remove unreacted residues of the sodium hydroxide aqueous solution on a surface of the third layered body, followed by purging the third layered body with deionized water. Then, the third layered body was immersed in ethanol for approximately 5 seconds, and dried using a nitrogen gas gun to form a fourth layered body. Lastly, the fourth layered body was placed in the high-temperature furnace so that a calcination treatment can be performed. The calcination treatment was performed at a temperature of about 500° C. for 1 hour, thereby obtaining a photocurrent-generating electrode, in which the first layer had a thickness of about 10 nm and the titanium dioxide layer had a thickness of about 227.3 nm.

Structural Analysis and Evaluation

A field emission scanning electron microscope (SEM) (manufacturer: Carl Zeiss A G, Germany; model: Ultra Plus), a high-resolution transmission electron microscope (HRTEM) (manufacturer: Nihon Denshi Kabushiki-gaisha (JEOL Ltd.); model: JEM-2010), and an atomic force microscope (AFM) (manufacturer: SII Nanotechnology Inc.; model: SPA-300HV) were used to obtain the following SEM, HRTEM, TEM, and AFM images. The high-resolution transmission electron microscope has an acceleration voltage that was set to range from about 8 KV to about 200 KV.

Figure 5:
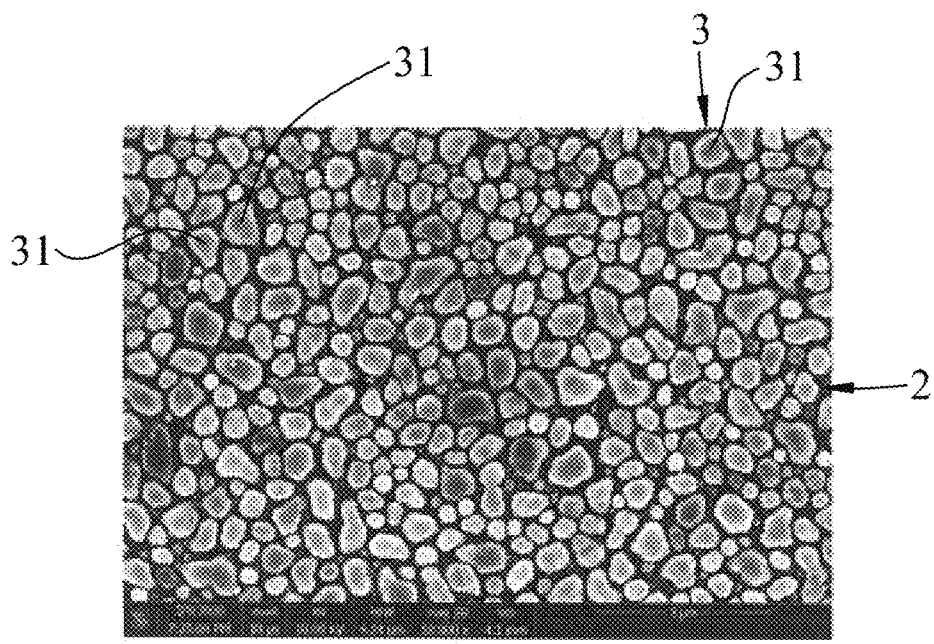
FIG. 5 is a scanning electron microscopy (SEM) image illustrating a top view of a first nanoparticle layer and a second nanoparticle layer of the photocurrent-generating electrode according to the present disclosure.

FIG. 5 is an SEM image illustrating a top view of the first nanoparticle layer 2 and the second nanoparticle layer 3. The first nanoparticle layer 2 and the second nanoparticle layer 3 may be observed before forming the semiconductor nanostructure 4. As shown in FIG. 5, a gap is present between two adjacent ones of the second gold nanoparticles 31.

Figure 6:
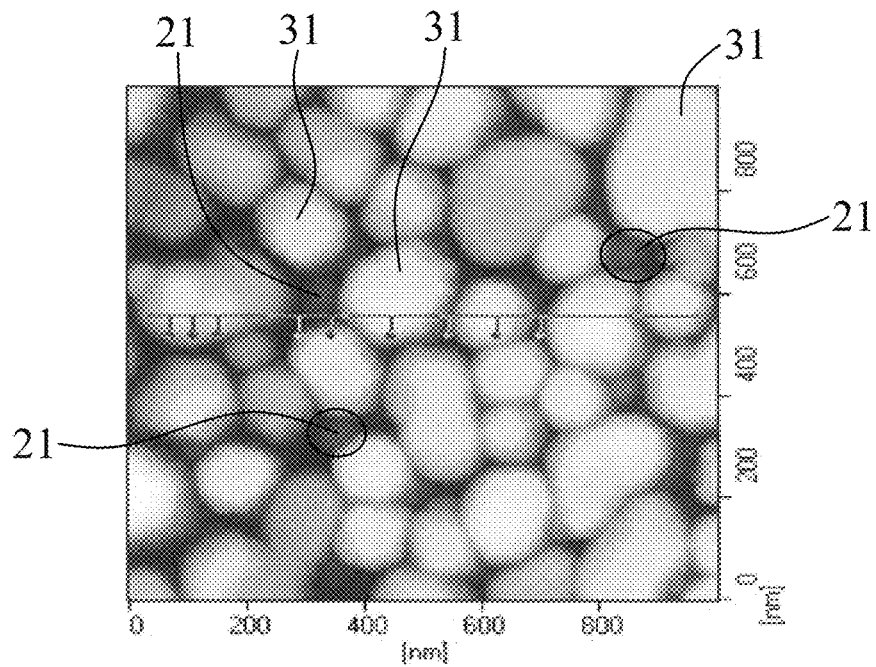
FIG. 6 is an atomic force microscopy (AFM) image illustrating an enlarged top view of the first and second nanoparticle layers.

FIG. 6 is an AFM image illustrating an enlarged top view of the first and second nanoparticle layers 2, 3. As shown in FIG. 6, two adjacent ones of the second gold nanoparticles 31 are electrically connected to each other through a corresponding one of the first gold nanoparticles 21.

Figure 7:
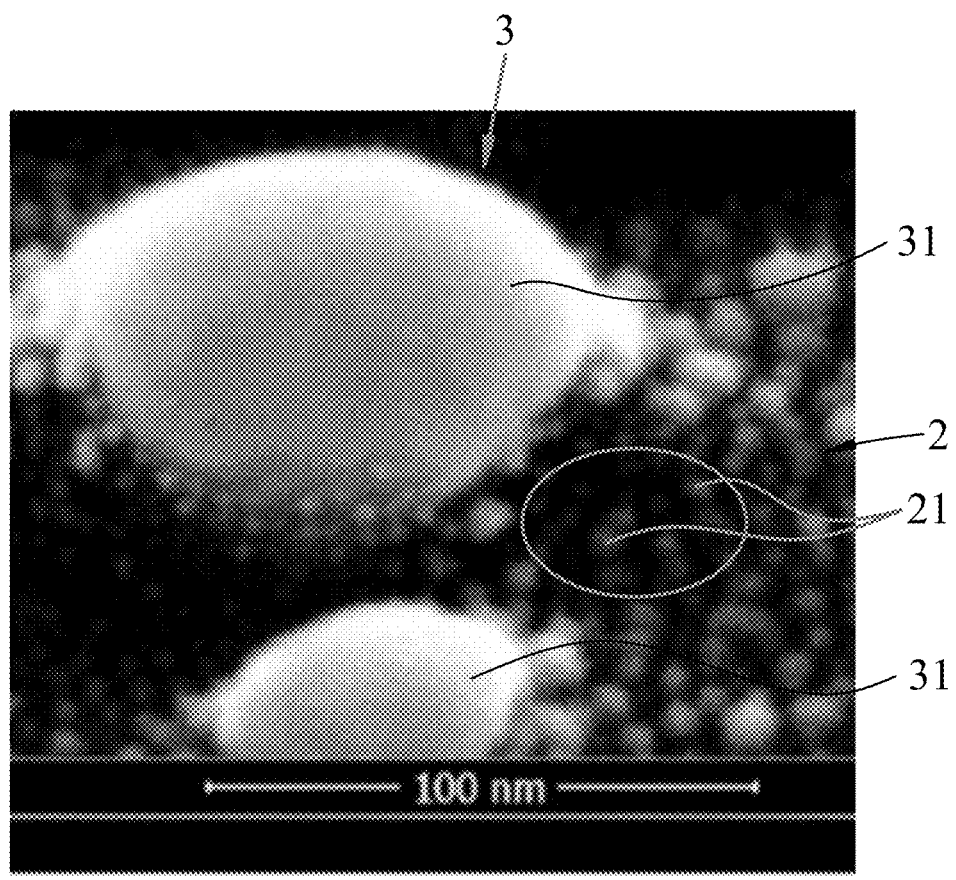
FIG. 7 is an SEM image illustrating another enlarged top view of the first and second nanoparticle layers.

FIG. 7 is another SEM image illustrating an enlarged view of the first and second nanoparticle layers 2, 3. A circle drawn in FIG. 7 shows the first gold nanoparticles 21 of the first gold nanoparticle layer 2.

Figure 8:
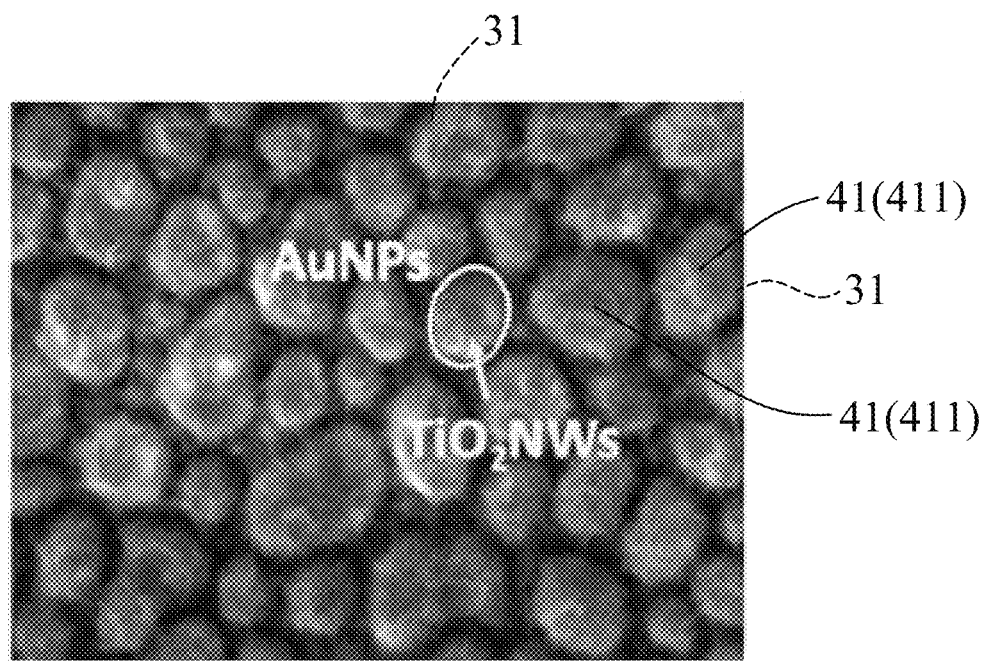
FIG. 8 is an SEM image illustrating nanowires being formed to surround nanoparticles of the second nanoparticle layer according to the present disclosure.

FIG. 8 is an SEM image illustrating nanowires 41 (i.e., titanium dioxide nanowires) being formed to surround the second gold nanoparticles 31 of the second nanoparticle layer 3.

Figure 9:
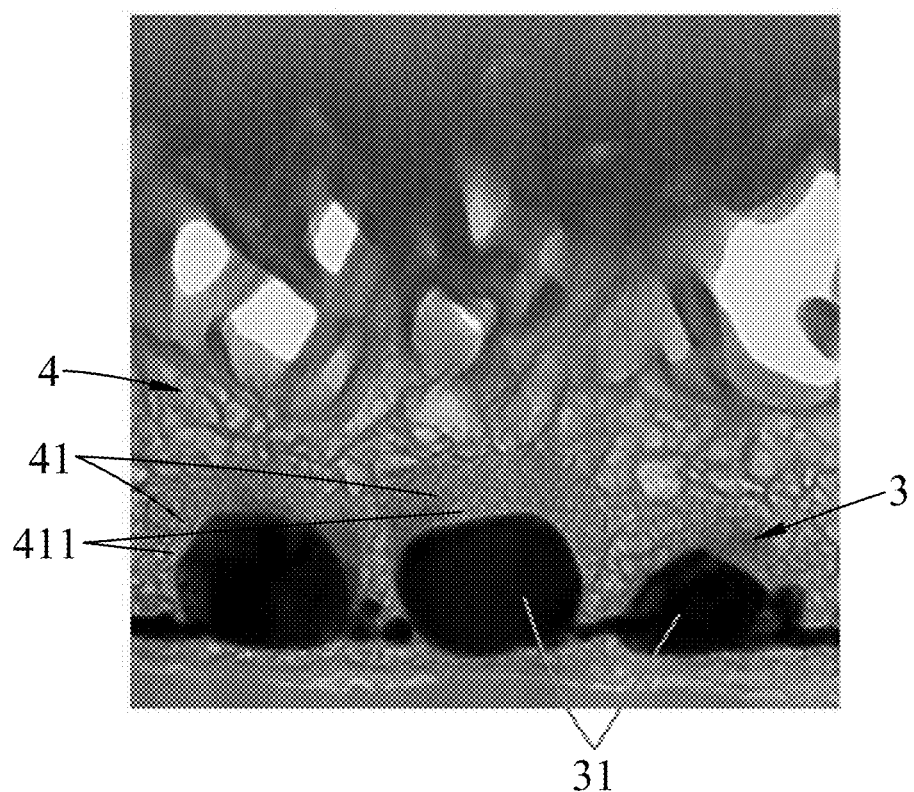
FIG. 9 is a transmission electron microscopy (TEM) image illustrating cross-sectional view of nanowires being formed to surround the nanoparticles of the second nanoparticle layer.

FIG. 9 is a TEM image illustrating a cross-sectional view of nanowires 41 being formed to surround the second gold nanoparticles 31 of the second nanoparticle layer 3. In FIGS. 8 and 9, a structure of the array of core-shell nanoparticles (which serves as the hybrid plasmonic quantum antenna monolayer) is shown. Each of the core-shell nanoparticles includes the second noble metal nanoparticle 31 and the semiconductor nanowires 41 (i.e., the nanowire portions 411 each surrounding a corresponding one of the second noble metal nanoparticles 31). The second noble metal nanoparticles 31 are gold nanoparticles, and the semiconductor nanowires 41 are titanium dioxide nanowires. The structure of the hybrid plasmonic quantum antenna monolayer of the photocurrent-generating electrode 5 results in the visible spectrum absorption effect, which will be described hereinafter.

Figure 10:
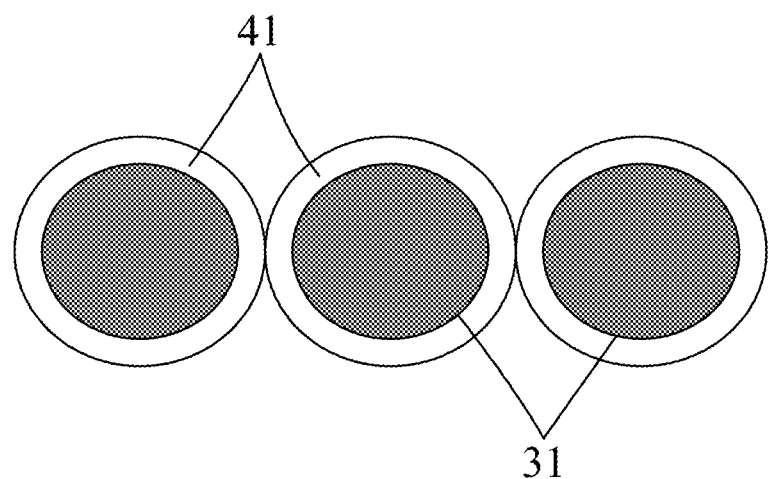
FIG. 10 is a schematic view illustrating core-shell nanoparticles shown in FIG. 9.

FIG. 10 is a schematic view illustrating the core-shell nanoparticles shown in FIG. 9. A core of each of the core-shell nanoparticles (colored black) represents the gold nanoparticle 31, and a shell of each of the core-shell nanoparticles (colored gray) represents the titanium dioxide nanowires 41.

Figure 11:
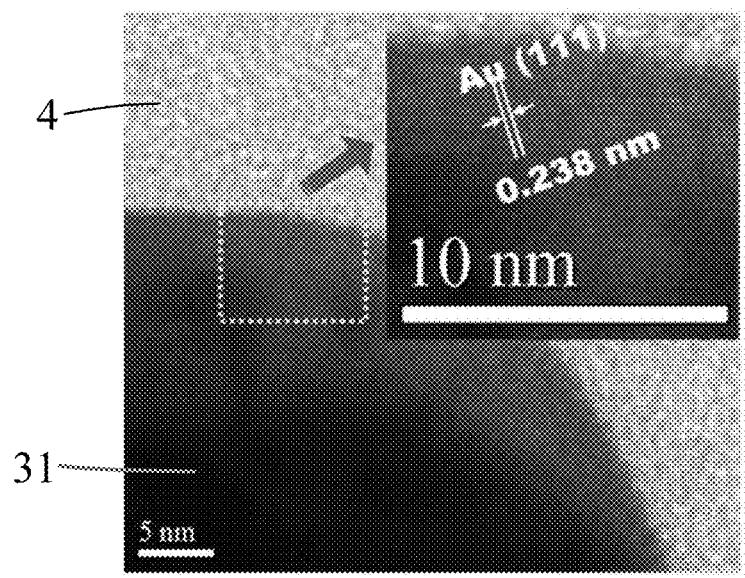
FIG. 11 is a high-resolution transmission electron microscopy (HRTEM) lattice image illustrating an interface between the nanoparticle of the second nanoparticle layer and a semiconductor nanostructure.

FIG. 11 is an HRTEM lattice image illustrating an interface between a second gold nanoparticle 31 and the semiconductor nanostructure 4. As shown in FIG. 11, the gold nanoparticle 31 has a single crystalline structure, and a lattice point spacing on the (111) plane of about 0.238 nm.

Figure 12:
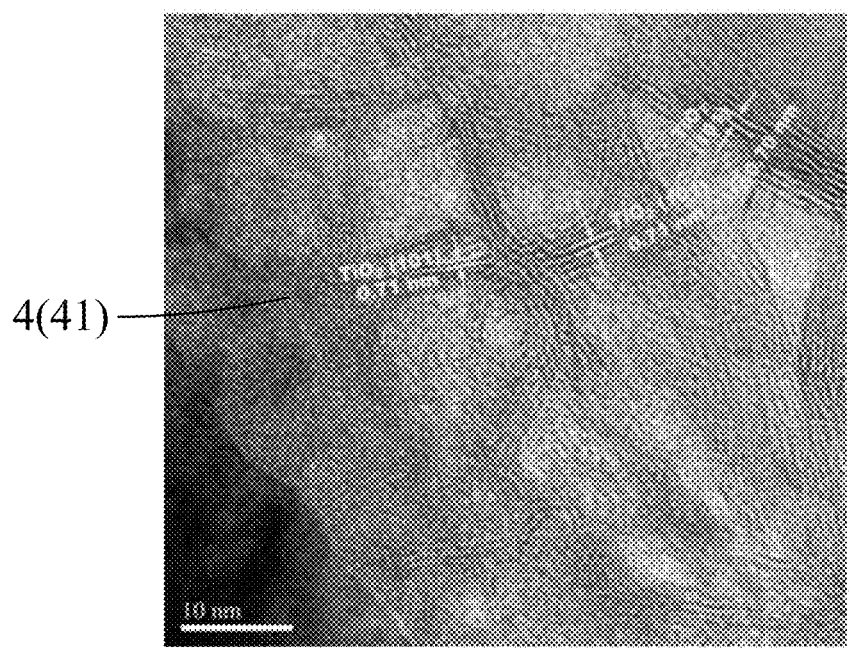
FIG. 12 is an HRTEM lattice image of the semiconductor nanostructure.

FIG. 12 is an HRTEM lattice image of the semiconductor nanostructure 4. As shown in FIG. 12, meshed networks are made of (101)-oriented anatase titanium dioxide nanowires 41, which constitute the semiconductor nanostructure 4, and the titanium dioxide nanowires 41 have a lattice point spacing on the (101) plane of about 0.71 nm. It can be inferred that the titanium dioxide nanowires 41 are bonded to the (111) plane of the gold nanoparticle 31.

Since the meshed networks constructed by the titanium dioxide nanowires have a diameter of less than about 5 nm, a quantum confinement effect is highly likely to be observed. As a result, the hybrid plasmonic quantum-antenna monolayer having the titanium dioxide nanowires 41 exhibits a remarkable absorption in the visible spectrum ranging from about 500 nm to about 800 nm.

Light Absorbance Evaluation

An ultraviolet-visible (UV-visible) spectrometer (manufacturer: Perkin Elmer; model: Lambda 900) was used to measure a light absorbance of each of the photocurrent-generating electrodes of E1, CE1, and CE2 at a wavelength scanning range of 300 nm to 700 nm. The results are shown in FIG. 13.

Figure 13:
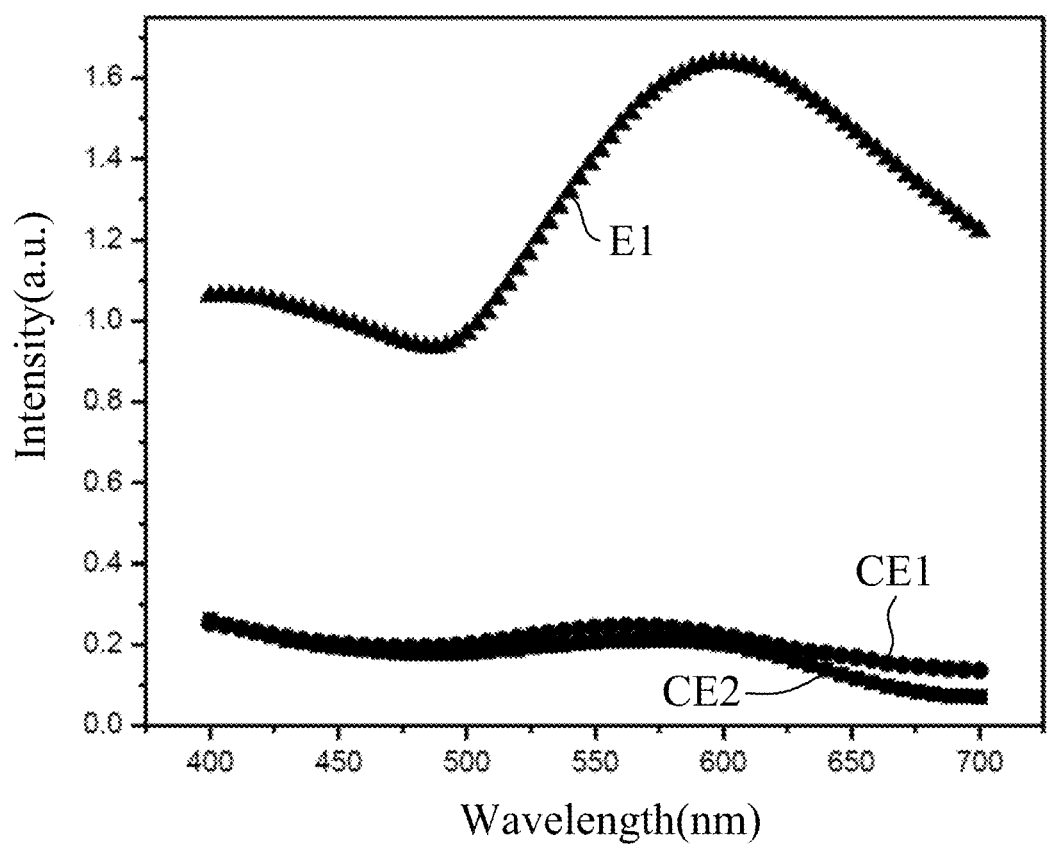
FIG. 13 is a diagram illustrating degree of absorption of visible light by photocurrent-generating electrodes of Example 1, Comparative Example 1, and Comparative Example 2 versus wavelength of the visible light according to the present disclosure.

Referring to FIG. 13, compared with the light absorbance of each of the photocurrent-generating electrodes of CE1 and CE2, the photocurrent-generating electrode of E1 has an excellent light absorbance for both visible light and infrared light.

Catalytic Efficiency Evaluation

Catalytic efficiency of each of the photocurrent-generating electrodes of E1, CE1, and CE2 was evaluated and compared as follows.

First, a respective one of the photocurrent-generating electrodes of E1, CE1, and CE2 was immersed in a malachite green solution (including water and malachite green, a concentration of the malachite green solution being 0.01 M), and was irradiated with a white light-emitting diode (LED) (CREE XLAMP XHP70.2 series, a luminous flux of the white LED being 248 lumens (lm)) for a period of time. Thereafter, the photocurrent-generating electrodes were taken out of the malachite green solutions, followed by subjecting the malachite green solutions to measurement using a Raman spectrometer, which is used to determine a scattering intensity of each of the malachite green solutions. The scattering intensity of the malachite green solution is in direct proportion with the concentration of the malachite green solution. Hence, according to the measured scattering intensities of the malachite green solutions and a formula $(\ln[A] = -kt + \ln[A]_0$, in which t is the irradiation time (unit: minutes), $[A]_0$ is an initial concentration of the malachite green solution, and $[A]$ is a concentration of malachite green solution after irradiation) derived from the first-order rate law, corresponding first-order rate constants (k) of the photocurrent-generating electrodes can be calculated. The calculated first-order rate constants of the photocurrent-generating electrodes of E1, CE1 and CE2 are shown in Table 1.

TABLE 1

| Photocurrent-generating electrode | E1 | CE1 | CE2 |
|---|---|---|---|
| k (min$^{-1}$) | 1.32 | ≈0 | ≈0 |

The result in Table 1 shows that the photocurrent-generating electrode of E1 has a first-order rate constant greater than those of the photocurrent-generating electrodes of CE1 and CE2. Therefore, it can be concluded that the photocurrent-generating electrode of E1 degrades and/or transforms malachite green much faster than the photocurrent-generating electrodes of CE1 and CE2, and that the photocurrent-generating electrode of E1 exhibits an excellent catalytic efficiency.

Sensitivity Evaluation

The sensitivity of the photocurrent-generating electrode of E1 was evaluated as follows.

First, 20 μL of an alpha-fetoprotein antibody solution including a phosphate buffer solution (purchased from MERCK, and including water and phosphate) and alpha-fetal protein antibodies (purchased from MyBioSource, Inc.; model no.: MBS530361) was prepared. The concentration of the alpha-fetoprotein antibodies in the alpha-fetoprotein antibody solution was 1000 ng/mL. The alpha-fetoprotein antibody solution was dropped on the photocurrent-generating electrode of E1 for reaction at room temperature for 1 hour. In this evaluation, the photocurrent-generating electrode of E1 was mounted to the photoelectric immunosensing device of the second embodiment (see FIGS. 3 and 4) so as to serve as the photocurrent-generating electrode 51. Then, a cleaning process was performed by washing the photocurrent-generating electrode of E1 with the phosphate buffer solution, followed by purging with ultrapure water so as to remove the alpha-fetal protein antibody that were not adsorbed on the photocurrent-generating electrode of E1. The cleaning process was performed multiple times. Next, the photocurrent-generating electrode of E1 was dried using a nitrogen gun. Thereafter, 20 μL of a human alpha-fetoprotein solution including a phosphate buffer solution (purchased from MERCK, and including water and phosphate) and human alpha-fetoprotein (purchased from MyBioSource, Inc.; model no.: MBS537909) was prepared. The concentration of the human alpha-fetoprotein in the human alpha-fetoprotein solution was 1000 ng/mL. The human alpha-fetoprotein solution was then dropped on the alpha-fetoprotein antibodies of the photocurrent-generating electrode of E1 for reaction at room temperature for 1 hour. Then, a cleaning process was performed by washing the photocurrent-generating electrode of E1 with the phosphate buffer solution, followed by purging with ultrapure water so as to remove the human alpha-fetoprotein that were not bonded to the alpha-fetoprotein antibody. The cleaning process was performed multiple times. Next, the photocurrent-generating electrode of E1 was dried using a nitrogen gun, followed by covering the photocurrent-generating electrode of E1 with the phosphate buffer solution. In this evaluation, a lamp of the CREE XLAMP XHP70.2 series with a luminous flux of 858 lumens was used to serve as the illuminator 71 of the optical unit 7 shown in FIG. 3. Thereafter, the optical unit 7 was used to irradiate the photocurrent-generating electrode of E1, and the signal processor 8 (purchased from CH Instrument (CHI); model no.: CHI611E) was used to obtain a first photocurrent density signal X1. After irradiation for a period of time, the optical unit 7 was turned off, and a second photocurrent density signal X2 can thus be obtained. The sensitivity of the photocurrent-generating electrode of E1 can be calculated as a ratio of the first photocurrent density signal X1 to the second photocurrent density signal X2. The sensitivity of the photocurrent-generating electrode of E1 is listed in Table 2 below.

The photocurrent-generating electrode of E1 was then replaced with the photocurrent-generating electrodes of CE1 and CE2, and the sensitivities of the photocurrent-generating electrodes of CE1 and CE2 were calculated using above-mentioned procedures. The sensitivities of the photocurrent-generating electrodes of CE1 and CE2 are listed in Table 2.

TABLE 2

| Photocurrent-generating electrode | E1 | CE1 | CE2 |
| --- | --- | --- | --- |
| Sensitivity | 35.9 | <10 | <10 |

The experimental data in Table 2 shows that the photocurrent-generating electrode of E1 has a superior sensitivity compared to those of the photocurrent-generating electrodes of CE1 and CE2.

The photocurrent-generating electrode of the present disclosure is capable of absorbing visible light and even infrared light due to the fact that the separation of electrons and holes is promoted. Promotion of the separation of electrons and holes occurs due to the surface plasmon resonance effect generated by the second nanoparticle layer 3 and a Schottky barrier formed at an interface of the semiconductor nanostructure 4 and the second nanoparticle layer 3 which serves as an electron absorber. Therefore, the photocurrent-generating electrode of the present disclosure has an excellent photocurrent density when irradiated by sunlight, illuminators, or even a light source with a low lumen output (for example, about 1000 lumens or less).

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A photocurrent-generating electrode comprising:
a supporting substrate;
a first nanoparticle layer having a plurality of first noble metal nanoparticles which are spaced apart from each other and which are firmly bonded to an upper major surface of said supporting substrate;
a second nanoparticle layer formed on said first nanoparticle layer opposite to said supporting substrate, and having a plurality of second noble metal nanoparticles which are spaced apart from each other and which have an average dimension larger than an average dimension of said first noble metal nanoparticles, two adjacent ones of said second noble metal nanoparticles being electrically connected to each other through a corresponding one of said first noble metal nanoparticles such that said second nanoparticle layer is capable of exhibiting surface plasmon resonance when stimulated by visible light; and
a semiconductor nanostructure formed on said second nanoparticle layer opposite to said supporting substrate, and including a biocompatible semiconductor nanomaterial.

2. The photocurrent-generating electrode according to claim 1, wherein said average dimension of said first noble metal nanoparticles ranges from 1 nm to 20 nm.

3. The photocurrent-generating electrode according to claim 1, wherein said average dimension of said second noble metal nanoparticles ranges from 50 nm to 200 nm.

4. The photocurrent-generating electrode according to claim 1, wherein each of said first noble metal nanoparticles is made of a material selected from the group consisting of copper, gold, silver, and combinations thereof.

5. The photocurrent-generating electrode according to claim 1, wherein each of said second noble metal nanoparticles is made of gold.

6. The photocurrent-generating electrode according to claim 1, wherein said semiconductor nanostructure has a porosity of greater than 60%.

7. The photocurrent-generating electrode according to claim 1, wherein said semiconductor nanostructure has semiconductor nanowires.

8. The photocurrent-generating electrode according to claim 1, wherein said biocompatible semiconductor nanomaterial is selected from the group consisting of titanium oxide, zinc oxide, tungsten oxide, niobium oxide, and combinations thereof.

9. The photocurrent-generating electrode according to claim 1, wherein said supporting substrate is made of a material selected from the group consisting of glass, ceramic, silicon, silicon carbide, silicon nitride, and combinations thereof.

10. The photocurrent-generating electrode according to claim 1, wherein said semiconductor nanostructure has a thickness ranging from 200 nm to 500 nm.

11. The photocurrent-generating electrode according to claim 1, wherein said semiconductor nanostructure has a plurality of nanowire portions which surround said second noble metal nanoparticles, respectively, so as to form an array of core-shell nanoparticles.

12. The photocurrent-generating electrode according to claim 11, wherein said array of core-shell nanoparticles serves as a hybrid plasmonic quantum antenna monolayer.

13. The photocurrent-generating electrode according to claim 11, wherein said second noble metal nanoparticles are made of gold and said nanowire portions are made of titanium oxide.

14. The photocurrent-generating electrode according to claim 1, wherein a ratio of said average dimension of said second noble metal nanoparticles to said average dimension of said first noble metal nanoparticles is not less than 5.

* * * * *